US008933457B2

(12) United States Patent
Lai

(10) Patent No.: US 8,933,457 B2
(45) Date of Patent: Jan. 13, 2015

(54) 3D MEMORY ARRAY INCLUDING CRYSTALLIZED CHANNELS

(71) Applicant: Macronix International Co., Ltd., Hsinchu (TW)

(72) Inventor: Erh-Kun Lai, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/934,638

(22) Filed: Jul. 3, 2013

(65) Prior Publication Data
US 2014/0264353 A1 Sep. 18, 2014

Related U.S. Application Data

(60) Provisional application No. 61/780,921, filed on Mar. 13, 2013.

(51) Int. Cl.
*H01L 29/10* (2006.01)
*H01L 21/02* (2006.01)
*H01L 27/115* (2006.01)

(52) U.S. Cl.
CPC ...... *H01L 21/02595* (2013.01); *H01L 27/1151* (2013.01); *H01L 27/11578* (2013.01)
USPC ........... 257/66; 438/466; 438/490; 257/E29.3

(58) Field of Classification Search
USPC ................ 257/66, E29.3; 438/466, 490
See application file for complete search history.

(56) References Cited

U.S. PATENT DOCUMENTS

2002/0028541 A1* 3/2002 Lee et al. ............... 438/149

OTHER PUBLICATIONS

Farhi, G., et al., "Study of the solid phase crystallization behavior of amorphous sputtered silicon by X-ray diffraction and electrical measurements", (2002), Solar Energy Materials & Solar Cells 72:551-558; 8 pgs.

* cited by examiner

*Primary Examiner* — Jami M Valentine
(74) *Attorney, Agent, or Firm* — Yiding Wu; Haynes Beffel & Wolfeld LLP

(57) ABSTRACT

A method for manufacturing a memory device includes forming a plurality of active layers alternating with insulating layers on a substrate where the active layers include an active material, etching the active layers and insulating layers to define a plurality of stacks of active strips, and after the etching, causing crystal growth in the active strips. The substrate can have a single crystalline surface with a crystal structure orientation, and the crystal growth in the active material can form crystallized material having the crystal structure orientation of the substrate at least near side surfaces of the active strips. Causing crystal growth includes depositing a seeding layer over the plurality of stacks and the substrate, where the seeding layer is in contact with the side surfaces of the active strips, and in contact with the substrate. The method can include, after causing crystal growth, removing the seeding layer.

12 Claims, 13 Drawing Sheets

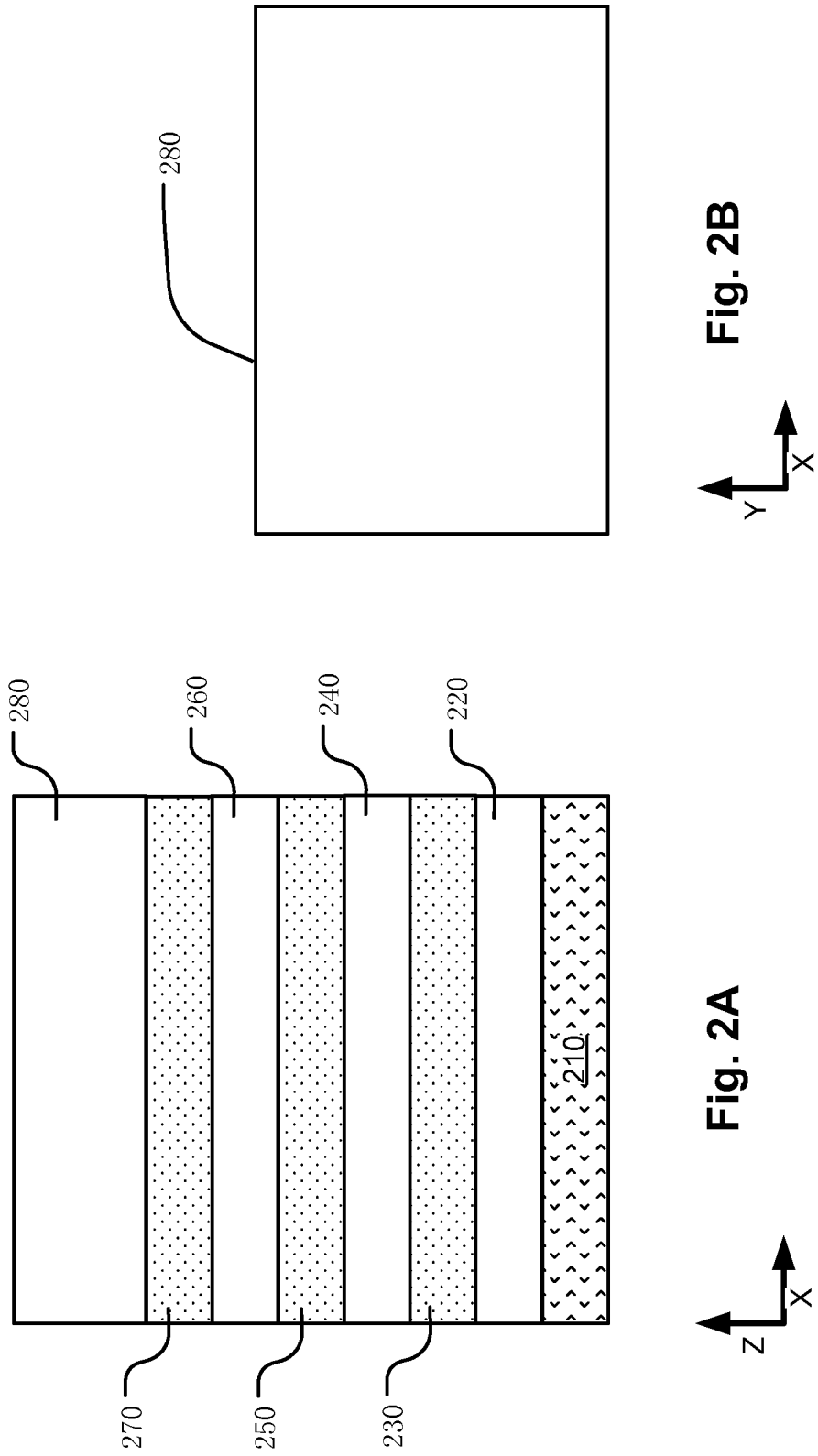

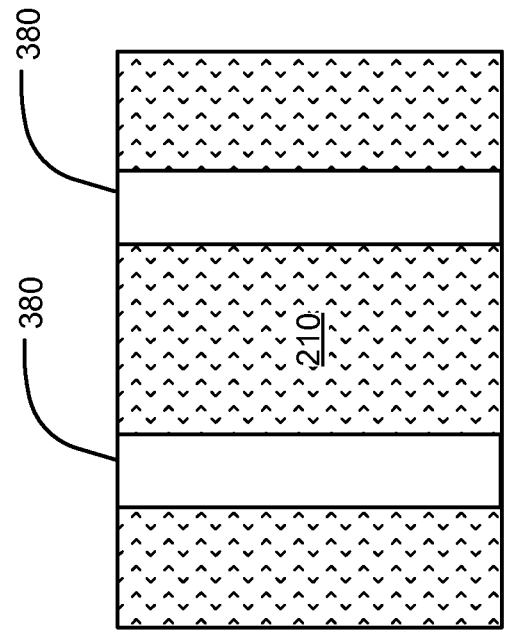
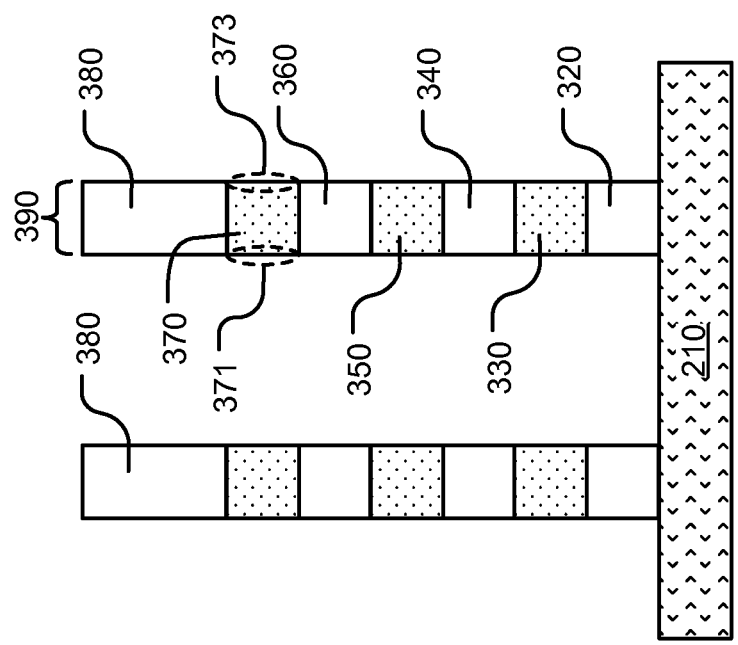
Fig. 3B
Fig. 3A

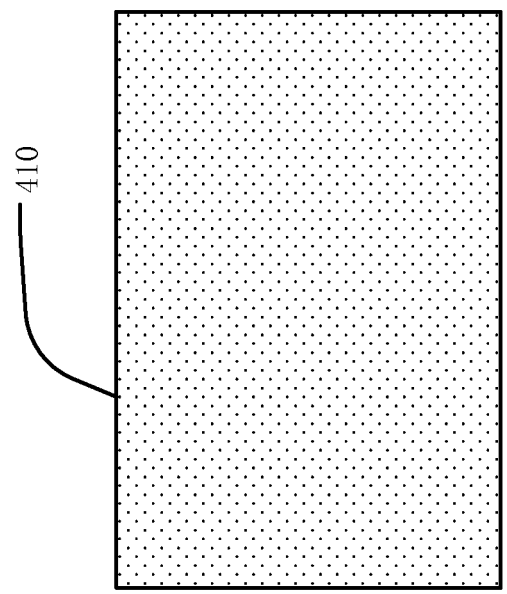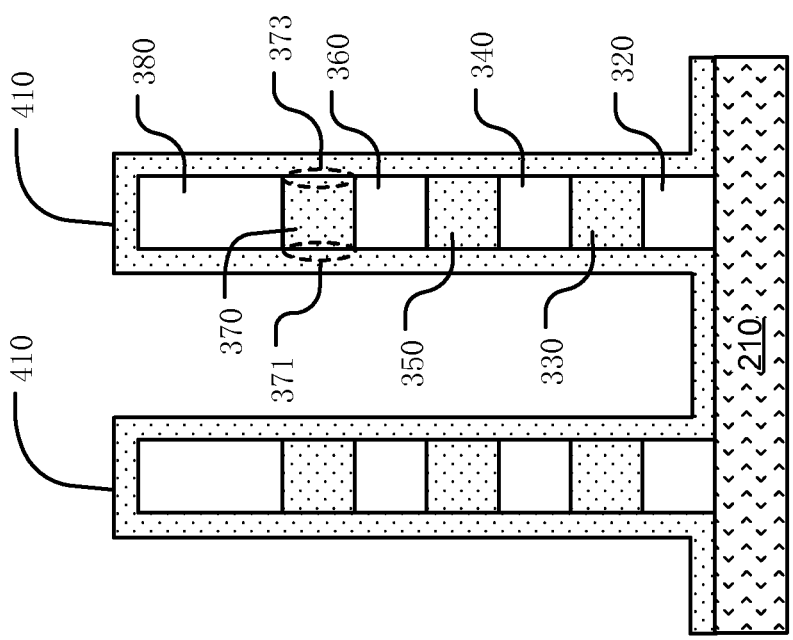

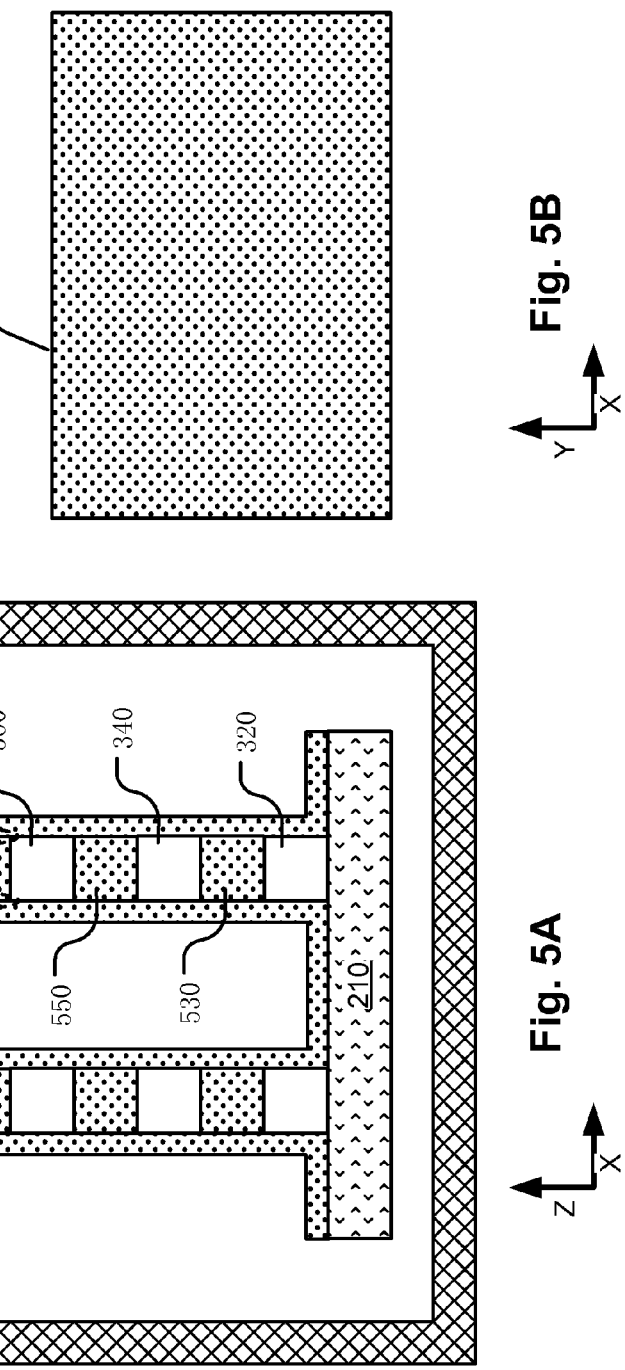

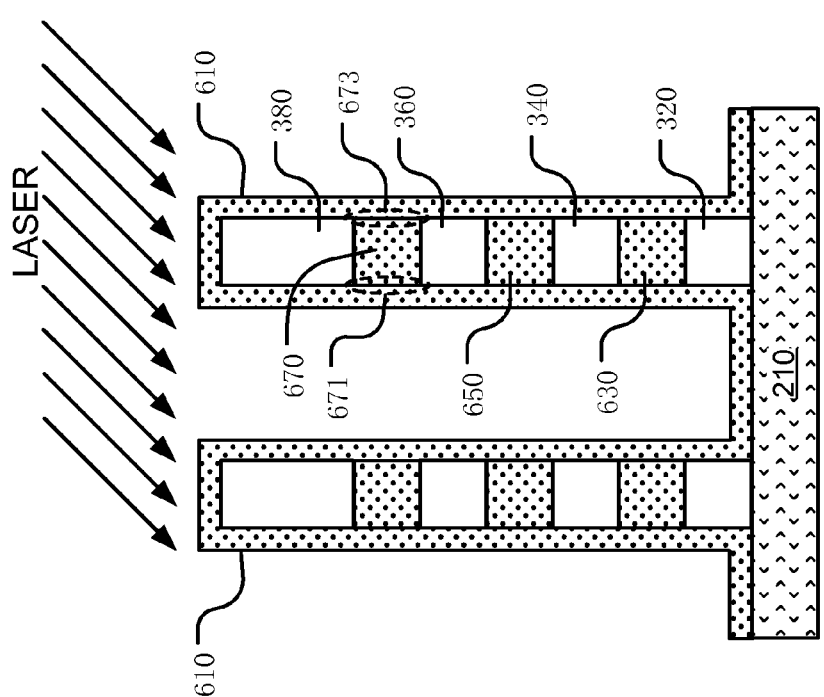

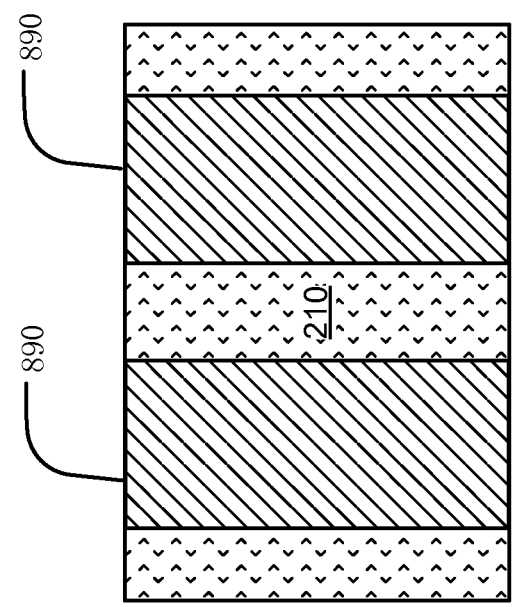
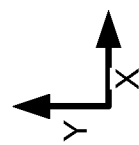
Fig. 8B
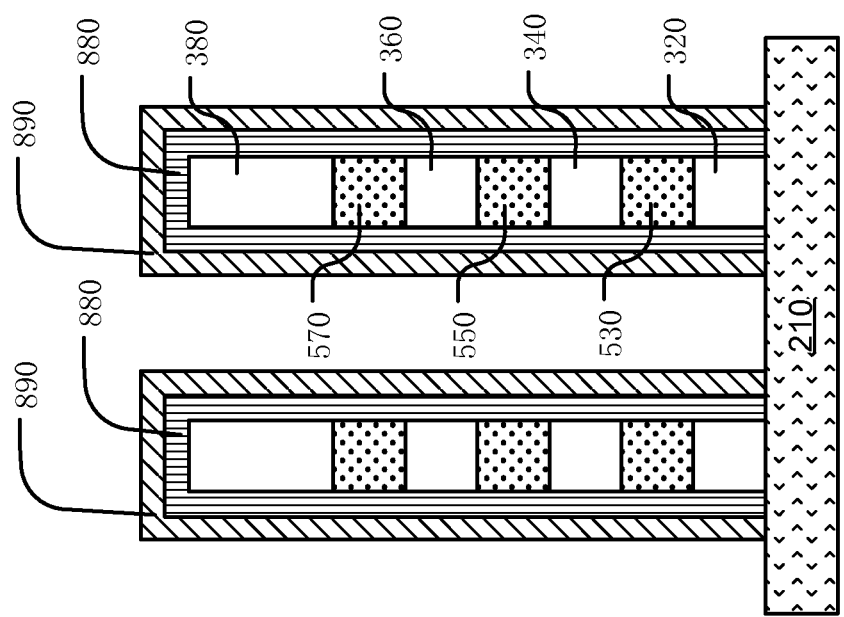
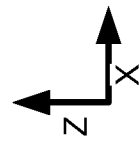
Fig. 8A

3D MEMORY ARRAY INCLUDING CRYSTALLIZED CHANNELS

RELATED APPLICATION

This application claims the benefit of U.S. Provisional Patent Application No. 61/780,921, filed 13 Mar. 2013. This application is related to U.S. patent application Ser. No. 13/772,058, filed 20 Feb. 2013. Both applications are incorporated herein by reference as if fully set forth herein.

BACKGROUND OF THE INVENTION

1. Field of the Invention

The present invention relates to three-dimensional (3D) memory devices, and more particularly to channel lines for memory cells in such memory devices.

2. Description of Related Art

High density memory devices are being designed that comprise arrays of flash memory cells, or other types of memory cells. In some examples, the memory cells comprise thin film transistors which can be arranged in 3D architectures.

In one example, a 3D memory device includes a plurality of stacks of poly crystalline active strips separated by insulating material. The active strips can act as bit lines or word lines. The 3D memory device can include a plurality of word lines structures arranged orthogonally over the plurality of stacks of active strips which act as bit lines. Alternatively, the 3D memory device can include a plurality of bit line structures arranged orthogonally over the plurality of stacks of active strips which act as word lines. Memory cells including charge storage structures are formed at cross-points between side surfaces of the active strips in the plurality of stacks and the word lines structures or bit line structures. Channel regions of memory cells are formed in the active material strips that can comprise polysilicon strips. The structure of these polycrystalline channel regions in memory cells can affect performance of 3D memory devices.

3D memory configurations, and other configurations using small dimension memory cells, can present challenges that relate to the performance of individual cells in the memory. It is desirable to improve performance of 3D memory devices.

SUMMARY OF THE INVENTION

A method for manufacturing a 3D memory device includes forming a plurality of stacks of active strips including an active material, having side surfaces, and alternating with insulating strips on the substrate, forming a plurality of vertical strips of active material between the plurality of stacks of active strips, and disposing memory elements at the crosspoints. The active material in one of the vertical strips and the active strips includes channel regions of memory cells in the device. As described herein, the method includes causing in situ crystal growth in the channel regions.

Where the channel regions are configured in the active strips, a process described herein includes forming a plurality of active layers alternating with insulating layers on a substrate where the active layers include an active material, and etching the plurality of active layers alternating with insulating layers to define a plurality of stacks of active strips including the active material, having side surfaces, and alternating with insulating strips on the substrate. The method includes, after the etching (and therefore in situ), causing crystal growth in the active strips. The active material includes polycrystalline silicon that has an average grain size prior to the crystal growth. Grains of silicon crystals are separated by grain boundaries that tend to decrease the electrical conductivity of the material. Furthermore, polycrystalline silicon with a smaller average grain size tends to decrease the electrical conductivity of the material more than polycrystalline silicon with a larger average grain size. The crystal growth can increase the average grain size in the active strips, improve conductivity of channel regions formed on the active strips for memory cells and, in turn, improve the performance of memory cells. The improved conductivity can be used for storing multiple bits per cell.

In one aspect of the technology, the substrate can have a single crystalline surface with a crystal structure orientation, and the crystal growth in the active material in the active strips can form crystallized material having the crystal structure orientation of the substrate at least near the side surfaces of the active strips. The step of causing crystal growth in the active strips includes depositing a seeding layer over the plurality of stacks and the substrate, where the seeding layer is in contact with the side surfaces of the active strips in the plurality of stacks, and in contact with the substrate. The seeding layer can include the active material of the active layers. The method can further include, after the step of causing crystal growth in the active strips, removing the seeding layer.

An integrated circuit device made according to the method is also provided.

Other aspects and advantages of the present invention can be seen on review of the drawings, the detailed description and the claims, which follow.

BRIEF DESCRIPTION OF THE DRAWINGS

FIGS. 2A-8B are top views and cross-sectional views illustrating sub-assemblies in a fabrication sequence of memory devices including crystallized material in channel regions of memory cells.

DETAILED DESCRIPTION

A detailed description of embodiments of the present invention is provided with reference to the FIGS. 1-12. The present invention can be applied to non-volatile memory and embedded memory including floating gate memory and charge trapping memory.

Figure 1A:
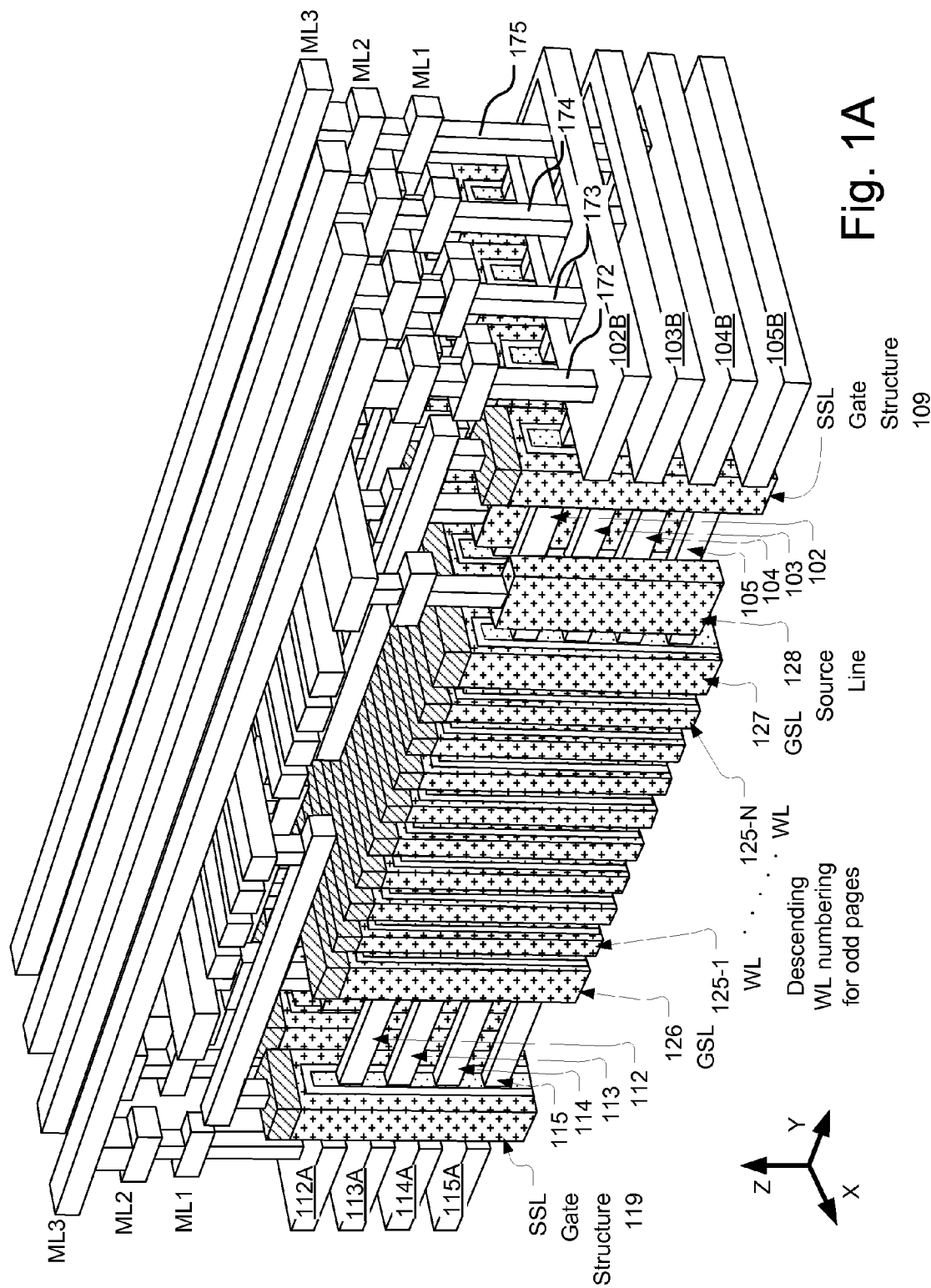
FIG. 1A is a perspective illustration of a three-dimensional (3D) NAND-flash memory device.

FIG. 1A is a perspective illustration of a three-dimensional (3D) NAND-flash memory device. The device illustrated in FIG. 1A includes stacks of active strips alternating with insulating strips. Insulating material is removed from the drawing to expose additional structure. For example, insulating strips are removed between the active strips in the stacks, and are removed between the stacks of active strips. This structure is described herein in some detail, as an example of a three-dimensional (3D) memory array which can be manufactured on a semiconductor substrate, in combination with peripheral circuits on the substrate (not shown). Other multilayer circuit structures can also be formed using the technology described herein.

In the example shown in FIG. 1A, a multilayer array is formed on an insulating layer, and includes a plurality of word lines 125-1 WL through 125-N WL conformal with the plurality of stacks. The plurality of stacks includes active strips 112, 113, 114, and 115 in multiple planes. Active strips in the same plane are electrically coupled together by bit line structures (e.g. 102B).

Bit line structures 112A, 113A, 114A, and 115A terminate active strips, such as the active strips 112, 113, 114, and 115 in the plurality of stack. As illustrated, these bit line structures 112A, 113A, 114A, and 115A are electrically connected to different bit lines for connection to decoding circuitry to select planes within the array. These bit line structures 112A, 113A, 114A, and 115A can be patterned at the same time that the plurality of stacks is defined.

Bit line structures 102B, 103B, 104B, and 105B terminate active strips, such as active strips 102, 103, 104, and 105. As illustrated, interlayer connectors 172, 173, 174, 175 electrically connect bit line structures 102B, 103B, 104B, and 105B to different bit lines in metal layers, such as a metal layer ML3, for connection to decoding circuitry to select planes within the array. These bit line structures 102B, 103B, 104B, and 105B can be patterned at the same time that the plurality of stacks is defined.

Any given stack of active strips is coupled to either the bit line structures 112A, 113A, 114A, and 115A, or the bit line structures 102B, 103B, 104B, and 105B, but not both. A stack of semiconductor bit lines has one of the two opposite orientations of bit line end-to-source line end orientation, or source line end-to-bit line end orientation. For example, the stack of active strips 112, 113, 114, and 115 has bit line end-to-source line end orientation; and the stack of active strips 102, 103, 104, and 105 has source line end-to-bit line end orientation.

The stack of active strips 112, 113, 114, and 115 is terminated at one end by the bit line structures 112A, 113A, 114A, and 115A, passes through SSL gate structure 119, ground select line GSL 126, word lines 125-1 WL through 125-N WL, ground select line GSL 127, and is terminated at the other end by source line 128. The stack of active strips 112, 113, 114, and 115 does not reach the bit line structures 102B, 103B, 104B, and 105B.

The stack of active strips 102, 103, 104, and 105 is terminated at one end by the bit line structures 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of active strips 102, 103, 104, and 105 does not reach the bit line structures 112A, 113A, 114A, and 115A.

A layer of memory material is disposed in interface regions at cross-points between surfaces of the active strips 112-115 and 102-105 and the plurality of word lines 125-1 WL through 125-N WL. Ground select lines GSL 126 and GSL 127 are conformal with the plurality of stacks, similar to the word lines.

Every stack of active strips is terminated at one end by bit line structures and at the other end by a source line. For example, the stack of active strips 112, 113, 114, and 115 is terminated at one end by bit line structures 112A, 113A, 114A, and 115A, and terminated on the other end by a source line 128. At the near end of the figure, every other stack of active strips is terminated by the bit line structures 102B, 103B, 104B, and 105B, and every other stack of active strips is terminated by a separate source line. At the far end of the figure, every other stack of active strips is terminated by the bit line structures 112A, 113A, 114A, and 115A, and every other stack of active strips is terminated by a separate source line.

Bit lines and string select lines are formed at the metals layers ML1, ML2, and ML3. Bit lines are coupled to a plane decoder (not shown). String select lines are coupled to a string select line decoder (not shown).

The ground select lines GSL 126 and 127 can be patterned during the same step that the word lines 125-1 WL through 125-N WL are defined. Ground select devices are formed at cross-points between surfaces of the plurality of stacks and ground select lines GSL 126 and 127. The SSL gate structures 119 and 109 can be patterned during the same step in which the word lines 125-1 WL through 125-N WL are defined. String select devices are formed at cross-points between surfaces of the plurality of stacks and string select (SSL) gate structures 119 and 109. These devices are coupled to decoding circuitry for selecting the strings within particular stacks in the array.

In the example shown in FIG. 1A, memory elements are formed in interface regions at cross-points between surfaces of the active strips 112-115 and 102-105 and the plurality of word lines 125-1 WL through 125-N WL. In operation, when voltage is applied to a gate structure of a memory element via one of the word lines, a channel region in a memory cell corresponding to the memory element beneath the gate structure is turned on. The technology described herein is directed to improving the performance of the channel region in a memory cell, which can improve the performance of thin film memory cells, such as those used in the 3D array of FIG. 1A. In comparison with amorphous silicon or smaller grain polysilicon, larger grain polysilicon can provide higher mobility, larger current on/off ratio and lower power consumption. Due to higher mobility, the cell current can be larger for better sensing by sense amplifiers. In addition, operation speed for read, write and erase can be faster with higher cell current. Higher current on/off ratio can provide lower power consumption. The technology described herein is applicable to multi-level cell (MLC) operations.

Figure 1B:
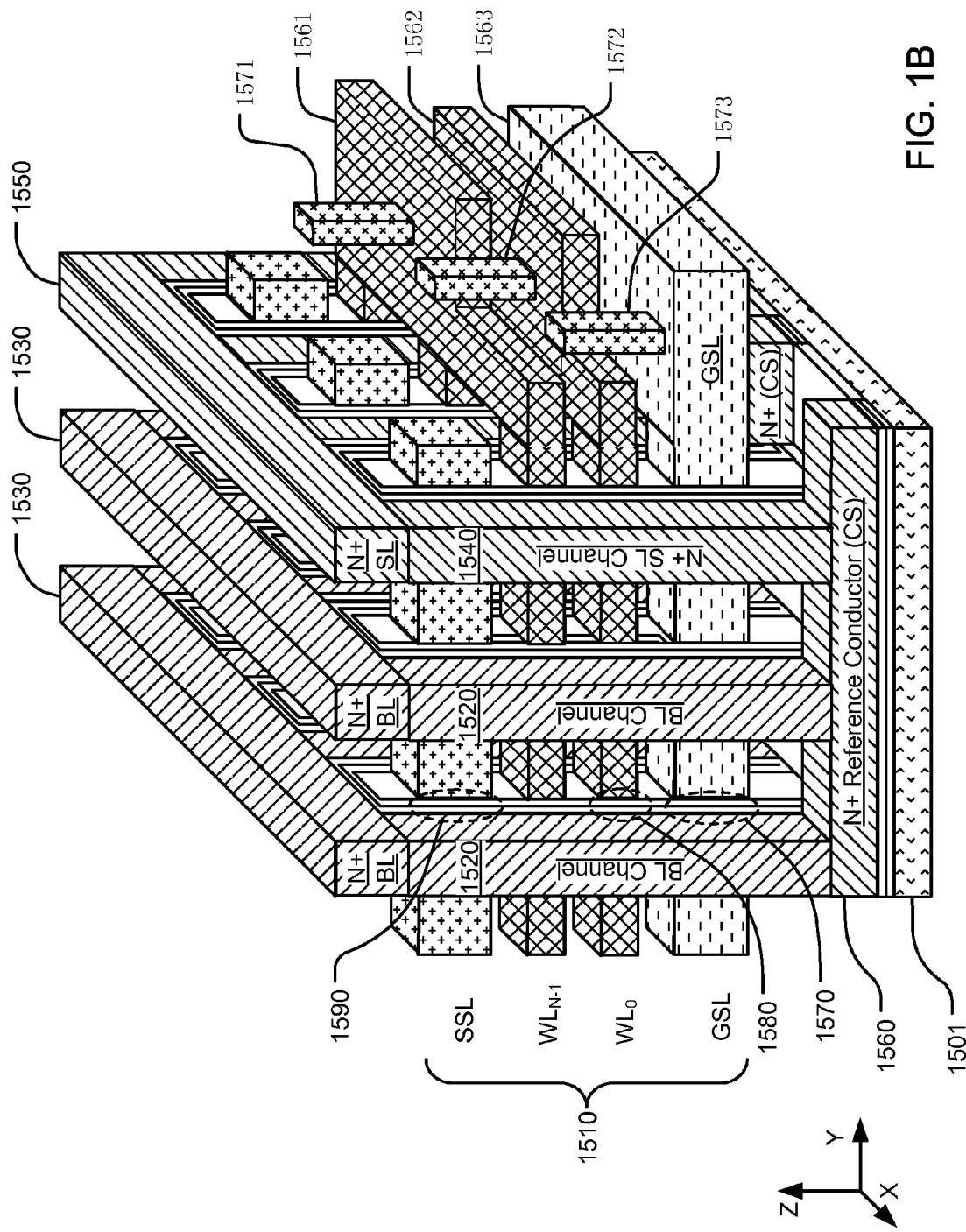
FIG. 1B is a perspective illustration of an alternative three-dimensional (3D) NAND-flash memory device.

FIG. 1B is a perspective illustration of an alternative three-dimensional (3D) NAND-flash memory device, which is described in co-pending U.S. patent application Ser. No. 13/772,058, which application is incorporated herein by reference as if fully set forth herein. The memory device includes an array of NAND strings of memory cells, and can be a double-gate vertical channel memory array (DGVC). The memory device includes an integrated circuit substrate 1501, and a plurality of stacks of active strips alternating with insulating material. The stacks include at least a bottom plane of active strips (GSL), a plurality of intermediate planes of active strips (WLs), and a top plane of active strips (SSLs). For example, a stack 1510 includes a bottom plane of active strips (GSL), a plurality of intermediate planes of active strips (WLs) ranging from $WL_0$ to $WL_{N-1}$, and a top plane of active strips (SSLs), where N can be 8, 16, 32, 64 and so on. The insulating material is removed from the drawing to expose additional structure. For example, the insulating material is removed between the active strips in the stacks, and is removed between the stacks of active strips.

In the example shown in FIG. 1B, a plurality of bit line structures are arranged orthogonally over, and have surfaces conformal with, the plurality of stacks, including inter-stack semiconductor body elements 1520 between the stacks and linking elements 1530 over the stacks connecting the semiconductor body elements 1520.

The memory device includes memory elements in interface regions at cross-points 1580 between side surfaces of the active strips in the plurality of intermediate planes (WLs) in the stacks and the inter-stack semiconductor body elements 1520 of the plurality of bit line structures.

A reference conductor 1560 is disposed between the bottom plane (GSL) of active strips and the integrated circuit substrate 1501. At least one reference line structure is arranged orthogonally over the plurality of stacks, including inter-stack semiconductor elements 1540 between the stacks in electrical communication with the reference conductor 1560, and linking elements 1550 over the stacks 1510 connecting the inter-stack semiconductor elements 1540. The semiconductor elements 1540 have a higher conductivity than the semiconductor body elements 1520.

The memory device includes string select switches 1590 at interface regions with the top plane of active strips, and reference select switches 1570 at interface regions with the bottom plane (GSL) of active strips.

In the example shown in FIG. 1B, the memory device can further include decoding circuitry coupled to the active strips in the plurality of stacks. The decoding circuitry can include word line decoding circuits, and string selection line decoding circuits coupled to the top plane of active strips (SSLs) in the plurality of stacks. String selection lines in the top plane of active strips are independently coupled to and controlled by the string selection line decoding circuits.

Active strips in the intermediate planes (WLs), and active strips in the bottom plane (GSL) are connected together to reduce decoder areas and consequently an overall size of the memory device. Active strips in the top plane (SSL) are individually decoded to allow correct bit line decoding.

The memory device can include linking elements, such as linking elements 1561 and 1562, connecting sets of word lines in the intermediate planes (WL), and interlayer connectors, such as interlayer connectors 1571 and 1572, coupled to landing areas in the linking elements 1561 and 1562, and to the word line decoding circuits (not shown). The landing areas are at interface regions between bottom surfaces of the interlayer connectors and top surfaces of the linking elements.

In the example shown in FIG. 1B, interlayer connectors (e.g. 1571 and 1572) for sets of word lines at multiple layers in the plurality of intermediate planes are arranged in a staircase structure, and are connected to landing areas at two different layers in the plurality of intermediate planes.

The memory device can include ground selection line decoding circuits coupled to the at least one bottom plane (GSL) of active strips in the plurality of stacks. The memory device can include linking elements, such as a linking element 1563, connecting sets of ground selection lines in the bottom plane (GSL) of active strips, and interlayer connectors, such as an interlayer connector 1573, coupled to landing areas in the linking elements, and to the ground selection line decoding circuits (not shown). The landing areas are at interface regions between bottom surfaces of the interlayer connectors, such as an interlayer connector 1573, and top surfaces of the linking elements, such as a linking element 1563.

In the example shown in FIG. 1B, the memory device includes a first overlying conductive layer (not shown) connected to the plurality of bit line structures, including a plurality of global bit lines coupled to sensing circuits. The memory device also includes a second overlying conductive layer (not shown) connected to the at least one reference conductor structure, coupled to a reference voltage source.

FIGS. 2A-8B are top views in an "X-Y" plane and cross-sectional views in an "X-Z" plane illustrating sub-assemblies in an example fabrication sequence of memory devices including crystallized material in channel regions of memory cells. For reference, X, Y and Z dimensions in FIGS. 2A-8B are consistent with the "X", "Y" and "Z" axes as shown in FIGS. 1A and 1B, where the "Y" axis lies in the horizontal direction parallel to the active strips in the structure, the "Z" axis lies in the vertical direction orthogonal to the active strips in the structure, and the "X" axis lies in the horizontal direction orthogonal to the "Y" axis. In FIGS. 2A-8B, the active strips can act as bit lines (e.g. bit lines 102-105 and 112-115 in FIG. 1A) or word lines (e.g. $WL_0$-$WL_{N-1}$ in FIG. 1B).

FIG. 2A illustrates a cross-section of a plurality of active layers (e.g. 230, 250, 270) alternating with insulating layers (e.g. 220, 240, 260, 280) formed on a substrate 210 for a partially fabricated memory device. Although only three active layers are illustrated, in embodiments, the number of active layers can be 8, 16, 32, 64, etc. Active layers in the plurality of active layers include an active material. The active material can include polycrystalline silicon or polysilicon. Insulating layers can include oxide materials. The substrate 210 has a crystal structure orientation. FIG. 2B illustrates a top view of the partially fabricated memory device showing a top insulating layer 280.

FIG. 3A illustrates a cross-section of a plurality of stacks of active strips (e.g. 330, 350, 370) alternating with insulating strips (e.g. 320, 340, 360, 380) on the substrate 210. The stacks are etched from the plurality of active layers (e.g. 230, 250, 270 in FIG. 2A) and the insulating layers (e.g. 220, 240, 260, 280 in FIG. 2A) by an etching process that cuts through the active layers and insulating layers, and stops at the substrate 210. The active strips include the active material, and have side surfaces (e.g. 371, 373). The active strips (e.g. 330, 350, 370) can act as bit lines (e.g. bit lines 102-105 and 112-115 in FIG. 1A) or word lines (e.g. $WL_0$-$WL_{N-1}$ in FIG. 1B). FIG. 3B illustrates a top view of the stacks showing top insulating strips 380 and a top surface of the substrate 210 between the stacks.

FIG. 4A illustrates a seeding layer 410 deposited over the plurality of stacks and the substrate, where the seeding layer 410 is in contact with the side surfaces (e.g. 371, 373) of the active strips (e.g. 330, 350, 370) in the plurality of stacks, and in contact with the substrate 210. As described herein, the active strips (e.g. 330, 350, 370) can act as bit lines (e.g. bit lines 102-105 and 112-115 in FIG. 1A) or word lines (e.g. $WL_0$-$WL_{N-1}$ in FIG. 1B). The seeding layer 410 can include the active material of the active strips (e.g. 370), such as polycrystalline silicon, or a material that is compatible in crystallization behavior with the active material of the active layers. The seeding layer 410 can have a thickness of between approximately 1 nanometer and 100 nanometers. FIG. 4B illustrates a top view of the seeding layer 410 over the plurality of stacks and the substrate. The seeding layer 410 may not be needed, or used, in some example processes. It can, however, act to form a crystal growth link between a single crystal substrate and the polycrystalline active regions, so that as a crystal orientation seed is provided by the substrate.

Polycrystalline silicon is used in the fabrication of thin film transistors. Polycrystalline silicon, such as initially deposited in the active layers (e.g. 230, 250, 270 in FIG. 2A), is a material including a relatively small average grain size for grains of silicon crystals. For instance, as initially deposited in the active layers, polysilicon average grain sizes can range between 1 nanometer and 100 nanometers. Smaller grains of silicon crystals in polycrystalline silicon after the etching process to form active strips as described herein can be converted to larger single-crystal silicon using annealing processes using thermal energy or using laser energy, to cause crystal growth in the polysilicon and resultant larger average grain sizes. For instance, active strips can have a width of less than 10 nanometers, while after the crystal growth, the increased average grain size can have a width of at least 20 nanometers.

Grains of silicon crystals are separated by thin grain boundaries. At the grain boundaries, grains of different orientations meet, resulting in electrical barriers and interface traps. Areas near grain boundaries can contain atoms that are displaced in the crystal structure of silicon, and impurities that have migrated to the grain boundaries. Thus, grain boundaries tend to decrease the electrical conductivity of the material. Grain boundaries can be in general only a few nanometers wide, for smaller or larger grains. Thus, for larger grains, there are fewer grain boundaries per unit volume and the grain boundaries account for a smaller fraction of the material, while for smaller grains, there are more grain boundaries per unit volume and they account for a larger fraction of the material. Accordingly, increased grain sizes of silicon crystals in polycrystalline silicon used to form channel regions of memory cells can improve the channel performance, such as by improving electrical conductivity of the material in an "on" condition.

In an annealing process using thermal energy, relatively high annealing temperatures are required during a controlled annealing time period. The annealing process using thermal energy can cause crystal growth that produces polycrystalline silicon with increased grain sizes. In one structure, the crystal growth can produce channel regions in the active layers that have a single crystalline surface. As shown in FIG. 3A, dimensions of the crystal growth can be described in X, Y and Z directions. In the X direction, the crystal growth is limited by a BL CD (bit line critical dimension) if the active strips act as bit lines as in the embodiment illustrated by FIG. 1A, or by a WL CD (word line critical dimension) if the active strips act as word lines as in the embodiment illustrated by FIG. 1B. In the Z direction, the crystal growth is limited by the film thickness of the active strips. The Y direction is longer than the X direction, and the current path is in the Y direction. A single crystalline surface or a surface with larger grain sizes in the Y direction of the active strips can increase the cell current. After an annealing process, such as solid-phase crystallization (SPC) or Excimer laser crystallization, is applied, grain sizes along the X and Z directions may change but is limited by the relatively small critical dimension (CD) and the clamping by the insulating strips (e.g. 320, 340, 360, 380 in FIG. 3A) below and above each active strips. But grain sizes along the Y direction can grow larger than in the X and Z directions due to longer dimension in the Y direction of the active strips. The solid-phase crystallization (SPC) or solid-phase epitaxial method (SPE) is an example annealing process. As applied to polycrystalline silicon, SPC can require annealing in a furnace or oven at a temperature of about 600 degrees Celsius for over 24 hours, or at a higher temperature of greater than 1000 degrees Celsius for faster thermal annealing in about 30 minutes or 1 hour. Solid-phase crystallization (SPC) is discussed in the second paragraph on page 96 in Fortunato et al., "Excimer laser crystallization techniques for polysilicon TFTs," Applied Surface Science, 154-155 (2000) 95-104, which is incorporated herein by reference.

In an annealing process using laser energy, short, high-intensity ultraviolet laser pulses can be used to heat surfaces of deposited polysilicon material to above the melting point of silicon, without damaging or melting the substrate. The molten silicon then crystallizes as it cools. By controlling duration of the laser pulses and the temperature in the duration, larger grains of silicon crystals can be grown. For instance, grain sizes can be grown to about 10 nanometers in cross-section or to the dimensions of a cross-section of an active strip. For instance, grain sizes can be grown to about 10000 nanometers (nm) or larger in the Y direction of the active strips. Grain sizes in the amorphous silicon as deposited without thermal treatment may be less than 5 nm. With treatment either by SPE (e.g. at 600 C for 24 hours), higher temperature (e.g. at 1000 C for 30 minutes), or Excimer laser crystallization, grain sizes can grow to 10000 nm or larger in the Y direction. In the X direction, the crystal growth is limited by BL CD (bit line critical dimension) if the active strips act as bit lines as in the embodiment illustrated by FIG. 1A, or by a WL CD (word line critical dimension) if the active strips act as word lines as in the embodiment illustrated by FIG. 1B. In the Z direction, the crystal growth is limited by the film thickness. Increased grain sizes in the Y direction are important because the cell current flows in the Y direction. Less grain boundaries and larger grain sizes in the Y direction can increase the cell current.

In addition, other methods such as RTA (rapid thermal anneal), spike annealing, and floating zone crystal growth can also be used for crystal growth in the active strips. RTA is a process used in semiconductor device fabrication that includes heating a single wafer at a time in order to affect its properties. Unique heat treatments can be designed for different effects. Spike annealing is a process on regions of a semiconductor device during manufacturing that controls annealing temperatures and annealing times for a pre-spike period, a spike period and a post-spike period. Floating zone crystal growth is a method that heats the polycrystalline material to create a localized molten zone through the polycrystalline material, using a seed crystal to start the crystal growth. The molten zone carries away impurities and thus reduces impurity concentration in the polycrystalline material to result in a single crystal. With these methods, wafers can be heated such that crystal growth in the active material in the active strips (e.g. 330, 350, 370) can form crystallized material having the crystal structure orientation of the substrate 210 at least near side surfaces (e.g. 371, 373) of the active strips (e.g. 370), where the substrate can act as the seed crystal for the crystallized material.

FIG. 5A illustrates crystal growth in the active strips caused by an annealing process using thermal energy. The active strips (e.g. 530, 550, 570) can act as bit lines (e.g. bit lines 102-105 and 112-115 in FIG. 1A) or word lines (e.g. $WL_0$-$WL_{N-1}$ in FIG. 1B). In the example shown in FIG. 5A, the memory device is placed in a thermal environment such as an oven 590 and subjected to an annealing process. The annealing process is controlled under an annealing temperature for an annealing time period. Various combinations of annealing temperatures with annealing time periods can be used for growing grain sizes of silicon crystals in polysilicon. In one embodiment, the annealing temperature can be approximately 600 degrees Celsius for an annealing time period of greater than 24 hours. In another embodiment, the annealing temperature can be approximately 1000 degrees Celsius for an annealing time period of approximately between 30 minutes and 60 minutes. The substrate 210 is underneath and a short distance from the active layers, thus a seeding layer 510, which can also include polycrystalline silicon, can provide a silicon source to connect with the silicon substrate 210 during an annealing process.

As a result of an annealing process as described herein, the crystal growth in the active material in the active strips (e.g. 530, 550, 570) forms crystallized material having the crystal structure orientation of the substrate 210 at least near side surfaces (e.g. 571, 573) of the active strips (e.g. 570). Polycrystalline silicon in the active material has an average grain size prior to the crystal growth Annealing can also be used for vertical channel devices, as shown as an example in FIG. 1B, to cause crystal growth in the active material used to provide channel regions. The crystal growth increases the average grain size, and thus improves conductivity of a channel region when the channel region is turned on, where the channel region is formed on the active strips including the crystallized material. The improved conductivity can be used for storing multiple bits per cell. FIG. 5B illustrates a top view of the seeding layer 510 over the plurality of stacks and the substrate after the crystal growth in the active strips (e.g. 530, 550, 570) and the seeding layer 510.

FIG. 6A illustrates crystal growth in the active strips caused by an alternative annealing process using laser energy. The active strips (e.g. 630, 650, 670) can act as bit lines (e.g. bit lines 102-105 and 112-115 in FIG. 1A) or word lines (e.g. $WL_0$-$WL_{N-1}$ in FIG. 1B). The description for FIG. 5A regarding a seeding layer and increased grain sizes of the polycrystalline silicon in the active material is generally applicable to FIG. 6A. In the example shown in FIG. 6A, the alternative annealing process using laser energy develops heat on at least side surfaces of the active strips. One example of an annealing process using laser energy is the excimer laser crystallization technique used in the fabrication of polysilicon thin-film transistors (TFTs). The excimer laser crystallization technique can develop high temperatures at side surfaces of the active strips (e.g. 671, 673) without significant heating (<400 degrees Celsius) of the substrate 210. The excimer laser crystallization techniques are applied to polysilicon TFTs in Fortunato et al., "Excimer laser crystallization techniques for polysilicon TFTs," Applied Surface Science, 154-155 (2000) 95-104, which is incorporated herein by reference.

As a result of the annealing process using laser energy as described, the crystal growth in the active material in active strips (e.g. 630, 650, 670) forms crystallized material having the crystal structure orientation of the substrate 210 at least near side surfaces (e.g. 671, 673) of the active strips (e.g. 670). Polycrystalline silicon in the active material has an average grain size prior to the crystal growth. The crystal growth increases the average grain size, and thus improves conductivity of a channel region when the channel region is turned on, where the channel region is formed on the active strips including the crystallized material. The improved conductivity can be used for storing multiple bits per cell. FIG. 6B illustrates a top view of the seeding layer 610 over the plurality of stacks and the substrate after the crystal growth in the active strips (e.g. 630, 650, 670) and the seeding layer 610.

Figure 7B:
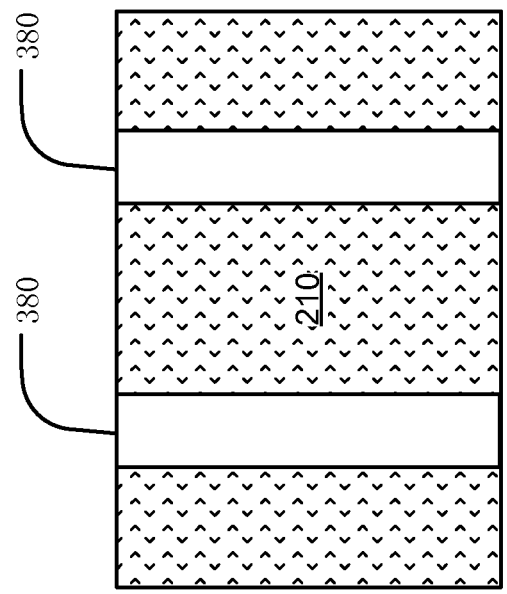
Figure 7A:
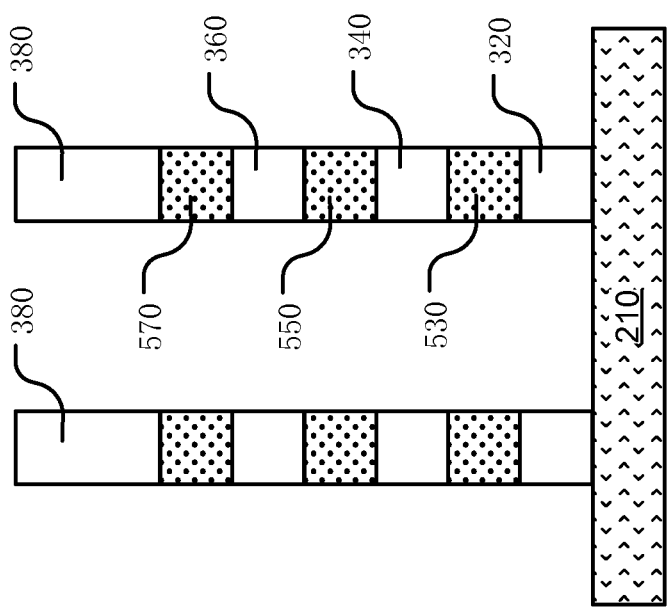

FIG. 7A illustrates a cross-section of a plurality of stacks of active strips (e.g. 530, 550, 570) including crystallized material alternating with insulating strips (e.g. 320, 340, 360, 380) on the substrate 210, after the seeding layer (e.g. 510 in FIG. 5A) is removed from the plurality of stacks and the substrate. As described herein, the active strips (e.g. 530, 550, 570) can act as bit lines (e.g. bit lines 102-105 and 112-115 in FIG. 1A) or word lines (e.g. $WL_0$-$WL_{N-1}$ in FIG. 1B). The seeding layer can be removed by an etching process such as chemical dry etching. Chemical dry etching is an etching process that can offer high etch selectivity of polycrystalline silicon and silicon nitride over silicon dioxide. Chemical dry etching can provide high polycrystalline silicon over oxide selectivity and isotropic etch to remove the seeding layer 610 without damaging the insulating strips (e.g. 320, 340, 360, 380). FIG. 7B illustrates a top view of the stacks showing top insulating strips 380 and a top surface of the substrate 210 between the stacks including crystallized material in the active strips.

In the example shown in FIG. 8A, a memory layer 880 is formed over the plurality of stacks of active strips, where the memory layer 880 is in contact with the side surfaces of the active strips (e.g. 530, 550, 570) in the stacks. As described herein, the active strips (e.g. 530, 550, 570) can act as bit lines (e.g. bit lines 102-105 and 112-115 in FIG. 1A) or word lines (e.g. $WL_0$-$WL_{N-1}$ in FIG. 1B). In one embodiment, the memory layer 880 can include charge storage materials and form charge storage structures. The charge storage materials can include dielectric charge storage structures, including bandgap engineered structures like ONONO (oxide-nitride-oxide-nitride-oxide) materials, and can include floating gate charge storage structures. A layer of second active material (890) is formed over and having a surface conformal with the memory layer (880). The layer of second active material (890) can then be etched to define a plurality of structures arranged orthogonally over, and having surfaces conformal with, the plurality of active strips in the stacks. The plurality of structures can be the plurality of word lines 125-1 WL through 125-N WL as illustrated in FIG. 1A, or a plurality of bit line structures including inter-stack semiconductor body elements 1520, as illustrated in FIG. 1B. Memory cells are disposed in interface regions at cross points between the side surfaces of the active strips and the plurality of structures, where the memory cells have channel regions in the active strips. FIG. 8B illustrates top surfaces of the layer of second active material (890) over the plurality of stacks and the top surface of the substrate 210 between the stacks.

Figure 9:
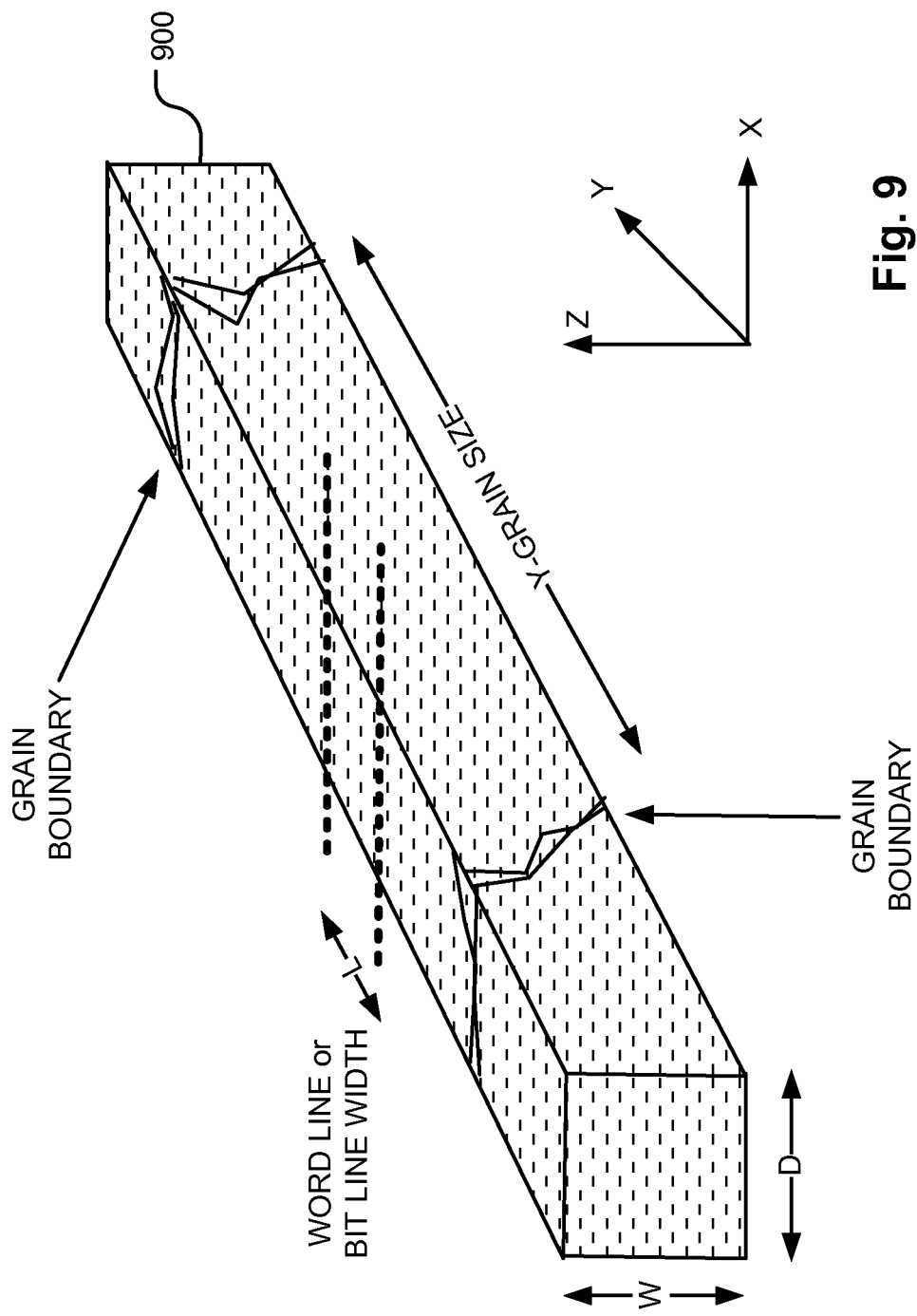
FIG. 9 is a perspective illustration of an active strip including crystallized material in memory cells.
Figure 10:
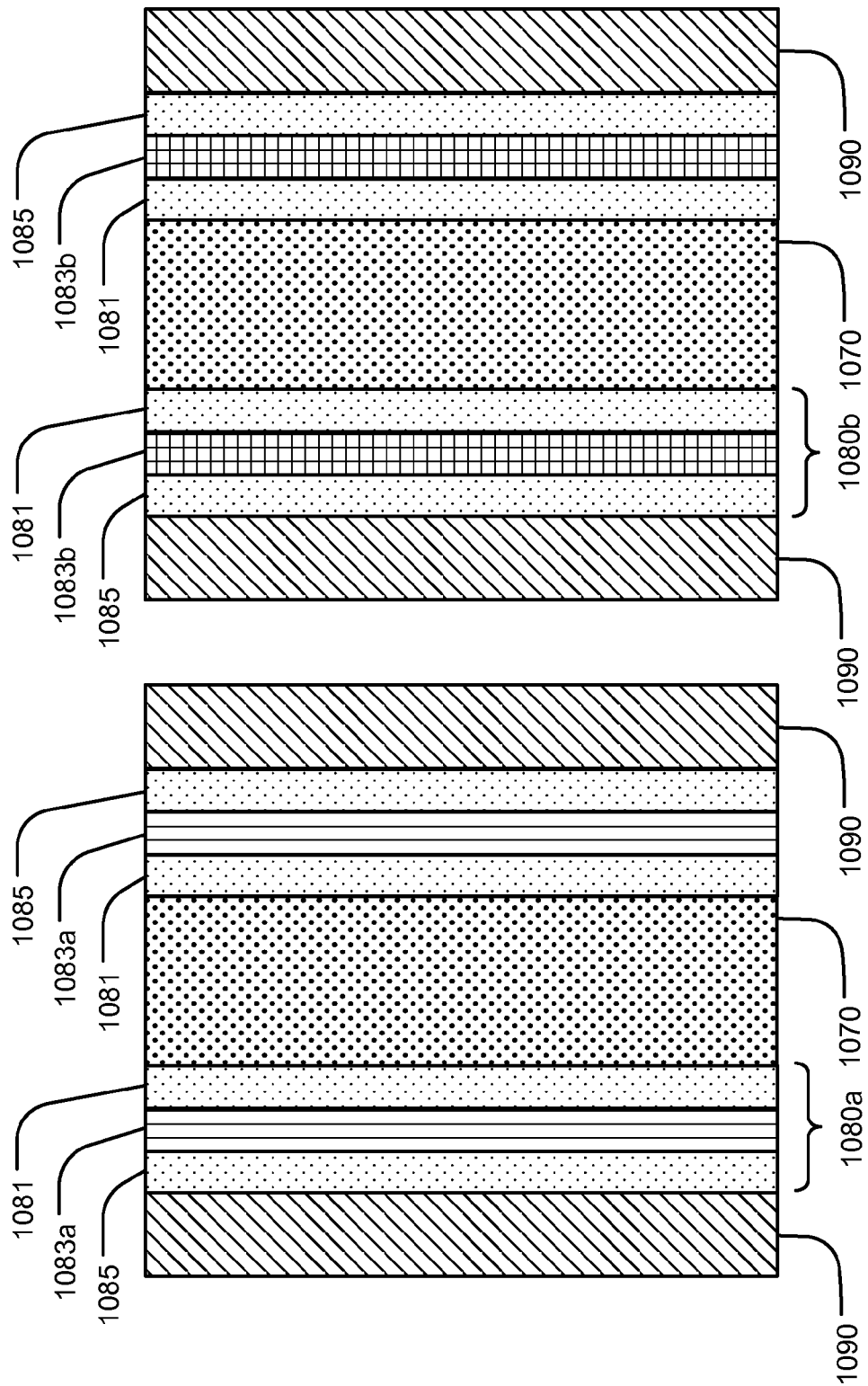
FIGS. 10A-10B are cross-sectional views of memory cells including charge storage structures.

FIG. 9 is a perspective illustration of an active strip 900 including crystallized material in memory cells. The active strip can be disposed as an active strip of the active strips (e.g. 102-105, 112-115) as shown in FIG. 1A, or the active strips (e.g. $WL_0$-$WL_{N-1}$) in FIG. 1B. For reference, X, Y and Z dimensions in FIG. 9 are consistent with the "X", "Y" and "Z" axes as shown in FIGS. 1A and 1B, where the "Y" axis lies in the horizontal direction parallel to the active strips in the structures, the "Z" axis lies in the vertical direction orthogonal to the active strips in the structures, and the "X" axis lies in the horizontal direction orthogonal to the "Y" axis. In FIG. 9, the active strips can act as bit lines (e.g. bit lines 102-105 and 112-115 in FIG. 1A) or word lines (e.g. $WL_0$-$WL_{N-1}$ in FIG. 1B).

Channels of the dual gate memory cells in the structures of FIG. 1A and FIG. 1B are formed in channel body regions in the active strips (e.g. 102-105, 112-115 in FIG. 1A, $WL_0$-$WL_{N-1}$ in FIG. 1B) along the Y dimension. The channel body regions have a channel body width W determined essentially by the thickness of the active strip in the Z dimension of the active strip. The channel body regions have a length L in the current flow dimension or the Y dimension, determined essentially by the width in the Y dimension of the word line structure (e.g. 125-1 WL-125-N WL in FIG. 1A) or the bit line structure (e.g. 1520 in FIG. 1B) or gate structure where it crosses the corresponding active strip. The channel body regions have a channel body depth D determined essentially by the width in the X dimension of the active strip. The channel depth D of a dual gate memory cell is a dynamic variable that depends on cell threshold, gate voltage, current magnitude and other features like doping concentrations. In a dual gate memory cell, in which the gate voltage is the same on both sides, the channel having the channel body width and length, grows inwardly from the opposing side surfaces as the cell bias exceeds threshold conditions, and current flows. When the dual gate memory cell is off, with gate voltages below threshold, a depletion region having the channel body width and length, forms also extending inwardly from the opposing side surfaces.

A dual gate memory cell has a channel body in a channel body region in an active strip in the plurality of stacks of active strips (e.g. 102-105, 112-115 in FIG. 1A or $WL_0$-$WL_{N-1}$ in FIG. 1B) with opposing first and second side surfaces, charge storage structures on the first and second side surfaces, and a gate structure or word line structure overlying the charge storage structures on the first and second side surfaces, where the gate structure has a width along the first and second side surfaces so that a grain size of the crystallized material in the active strip in a direction along the first and second side surfaces is greater than a width of the gate structure, where the direction is the current flow direction through the active strip or the Y dimension.

As illustrated in FIG. 9, the active strip 900 has increased grain sizes after crystal growth caused by an annealing process using thermal energy or laser energy as described herein. Before an annealing process is applied to active strips, average grain sizes of polysilicon as initially deposited in the active strips can be between 1 nanometer and 100 nanometers. After the crystal growth, the increased average grain size can be at least 40 nanometers. As described herein, in the X dimension, the crystal growth is limited by the bit line critical dimension (BL CD) if the active strips act as bit lines as in the embodiment illustrated by FIG. 1A, or by the word line critical dimension (WL CD) if the active strips act as word lines as in the embodiment illustrated by FIG. 1B. As described herein, in the Z dimension, the crystal growth is limited by the insulation layers below and above the active strips. In one embodiment, an increased grain size in the Y direction between opposite grain boundaries as shown in FIG. 9 can be larger than the length L of the channel body of the active strip or the width in the Y dimension of the word line structure. In an alternative embodiment, an increased grain size in the Y direction can be greater than the pitch of two dual gate memory cells, where the pitch of one dual gate memory cell is 2F, and 1F is the width in the Y dimension of the word line structure or the length L of the channel body of the active strip. In other embodiments, an increased grain size in the Y direction can be greater than 100 nanometers, 500 nanometers, 1000 nanometers, or 10000 nanometers.

For instance, if 32 dual gate memory cells are formed on an active strip (e.g. 900 in FIG. 9), each with a 2F pitch for F equal for example to 40 nm, then 6 dual gate memory cells can be formed on a portion of an active strip with an increased grain size of 500 nm in the Y direction, because 2F is 80 nm and 6×80 nm is 480 nm which is about 500 nm. Similarly, 60 dual gate memory cells can be formed on a portion of an active strip with an increased grain size of 5000 nm in the Y direction.

Further, interlayer connectors (e.g. 172, 173, 174, 175 in FIG. 1A, 1571, 1572 in FIG. 1B) can be formed and be connected to respective active strips (e.g. 102-105 in FIG. 1A, $WL_0$-$WL_{N-1}$ in FIG. 1B, or 530, 550, 570 in FIG. 8A) in the stacks, for example via bit line structures (e.g. 102B, 103B, 104B, and 105B in FIG. 1A) or via linking elements (e.g. 1561-1562 in FIG. 1B). Patterned conductor lines (e.g. ML3 in FIG. 1A) can be formed and be connected to the respective interlayer connectors.

An integrated circuit device, such as the memory devices described for FIGS. 1A and 1B, can include circuitry to induce a current density in an active strip in the plurality of stacks of active strips during read operations of greater than $10^2$ amperes per square centimeters ($10^2$ A/cm$^2$). For instance, the current density can be between $10^2$ amperes per square centimeters ($10^2$ A/cm$^2$) and $10^8$ amperes per square centimeters ($10^8$ A/cm$^2$). For instance, the active strip can be the active strip 900 as illustrated in FIG. 9.

FIG. 10A is a cross-sectional view of a memory cell including a dielectric charge storage structure 1080a. An active strip 1070 in the memory cell includes a crystallized material having the crystal structure orientation of the substrate (e.g. 210 in FIG. 8A) at least near side surfaces of the active strip 1070. The active strip (e.g. 1070) can act as a bit line (e.g. bit lines 102-105 and 112-115 in FIG. 1A) or a word line (e.g. $WL_0$-$WL_{N-1}$ in FIG. 1B). The crystallized material can improve electrical conductivity for the memory cell in accordance with the present application as described herein. The dielectric charge storage structure 1080a includes a tunneling oxide layer 1081, a dielectric charge trapping layer 1083a, and a blocking oxide layer 1085. A layer of active material 1090 is formed over dielectric charge storage structures including the dielectric charge storage structure 1080a. The layer of active material 1090 can be etched to define a plurality of structures arranged orthogonally over, and having surfaces conformal with, active strips including the active strip 1070. The plurality of structures can be the plurality of word lines 125-1 WL through 125-N WL as illustrated in FIG. 1A. FIG. 10B is a cross-sectional view of a memory cell including an alternative charge storage structure 1080b. The description for FIG. 10A is generally applicable to FIG. 10B. The difference in FIG. 10B is that the alternative charge storage structure 1080b includes a polysilicon floating gate layer 1083b between the tunneling oxide layer 1081 and the blocking oxide layer 1085.

Figure 11:
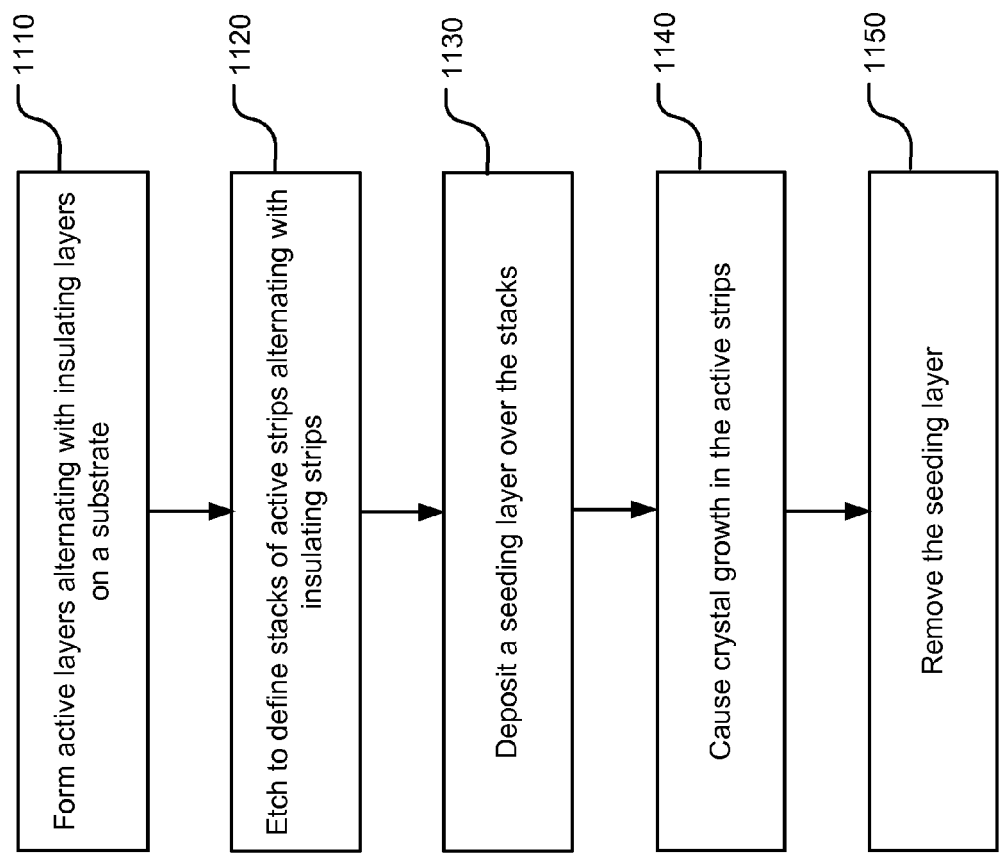
FIG. 11 is a simplified flowchart of an embodiment of a method for manufacturing a memory device.

FIG. 11 is a simplified flowchart of an embodiment of a method for manufacturing a memory device. The method includes forming a plurality of active layers alternating with insulating layers on a substrate where the active layers include an active material (1110). The active material can include polycrystalline silicon. The method includes etching the plurality of active layers alternating with insulating layers to define a plurality of stacks of active strips including the active material, having side surfaces, and alternating with insulating strips on the substrate (1120). The method can include depositing a seeding layer over the plurality of stacks and the substrate, where the seeding layer is in contact with the side surfaces of the active strips in the plurality of stacks, and in contact with the substrate (1130). The method includes causing crystal growth in the active strips (1140), including applying an annealing process using thermal energy or using laser energy. The substrate has a single crystalline surface with a crystal structure orientation. The crystal growth in the active material in the active strips forms crystallized material having the crystal structure orientation of the substrate at least near the side surfaces of the active strips. The method can further include, after causing crystal growth in the active strips, removing the seeding layer (1150).

Causing crystal growth can include transitioning the active material in the active strips from a first state to a second state. For instance, the first state can be an amorphous state while the second state can be a polycrystalline state or a crystalline state. For another instance, the first state can be a molten state while the second state can be a crystal state. In yet another instance, the first state can be a tiny polycrystalline state while the second state can be a large or very large polycrystalline or a crystal state. There can also be changes from one crystal state to another crystal state.

Figure 12:
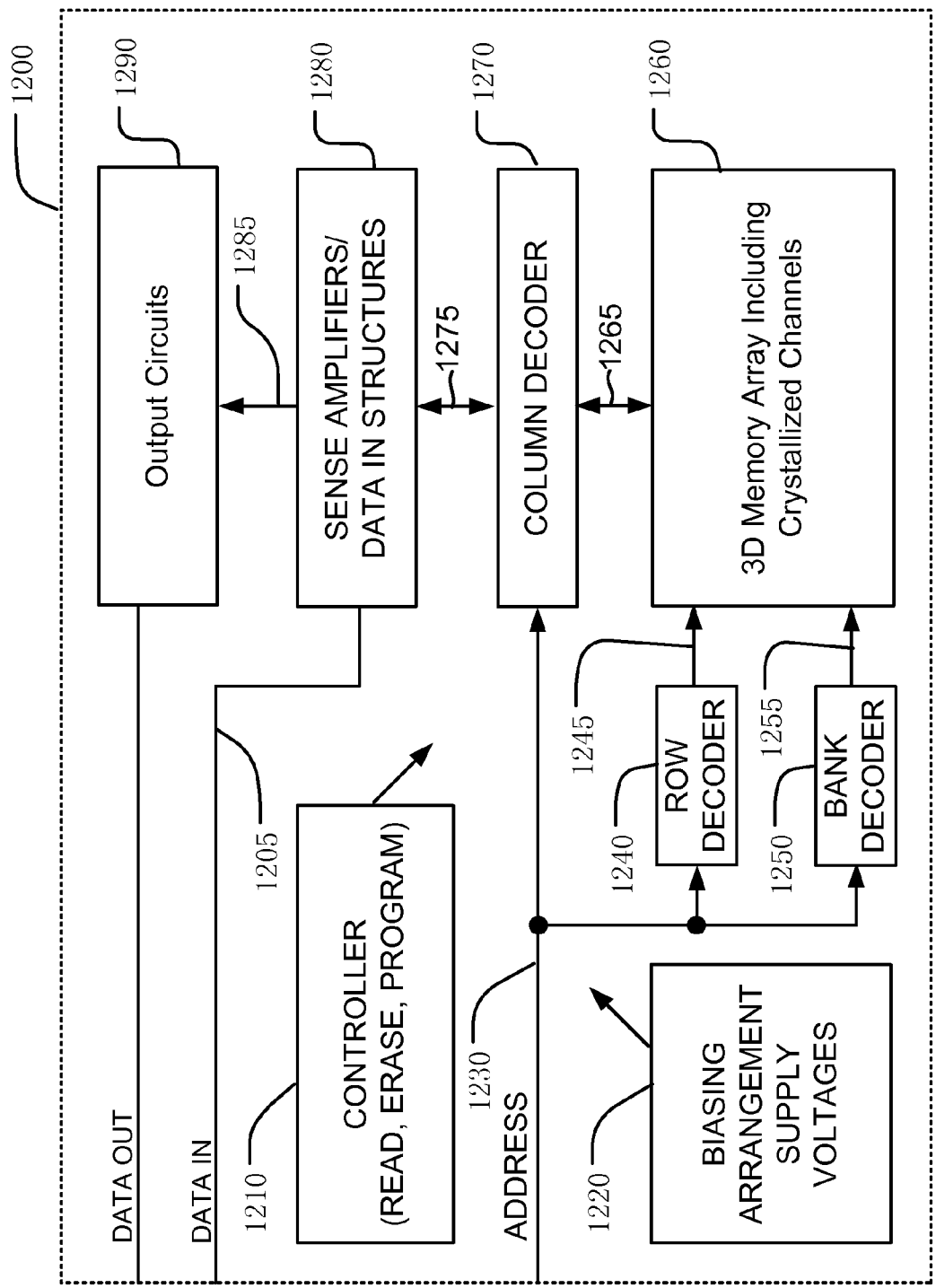
FIG. 12 is a simplified block diagram of an integrated circuit memory device according to an embodiment.

FIG. 12 is a simplified block diagram of an integrated circuit memory device according to an embodiment. The integrated circuit 1200 includes a memory array 1260 on an integrated circuit substrate. The memory array 1260 includes crystallized material in channel regions of memory cells. The channel regions with crystallized material can have larger polysilicon grain sizes resultant from crystallization by thermal annealing than the grain sizes from originally deposited polysilicon. The channel regions with crystallized material can have the same crystal structure orientation or the same grain sizes as the substrate.

A row decoder 1240 is coupled to a plurality of word lines 1245, and arranged along rows in the memory array 1260. A column decoder 1270 is coupled to a plurality of bit lines 1265 arranged along columns in the memory array 1260 for reading and programming data from the memory cells in the memory array 1260. A bank decoder 1250 is coupled to a plurality of banks in the memory array 1260 on bus 1255. Addresses are supplied on bus 1230 to column decoder 1270, row decoder 1240 and bank decoder 1250. Sense amplifiers and data-in structures in block 1280 are coupled to the column decoder 1270, in this example via data bus 1275. Sensed data from the sense amplifiers are supplied via output data lines 1285 to output circuits 1290. Output circuits 1290 drive the sensed data to destinations external to the integrated circuit 1200. Input data is supplied via the data-in line 1205 from input/output ports on the integrated circuit 1200 or from other data sources internal or external to the integrated circuit 1200, such as a general purpose processor or special purpose application circuitry, or a combination of modules providing system-on-a-chip functionality supported by the memory array 1260, to the data-in structures in block 1280.

In the example shown in FIG. 12, a controller 1210 using a bias arrangement state machine controls the application of bias arrangement supply voltage generated or provided through the voltage supply or supplies in block 1220, such as read and program voltages. The controller 1210 can include modes of operation for multi-level cell (MLC) programming and reading. The controller 1210 can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device, comprising:
    a substrate; and
    a plurality of stacks of active strips having side surfaces and alternating with insulating strips on the substrate, wherein the active strips include a crystallized material; and
    a dual gate memory cell having a channel body in an active strip in the plurality of stacks of active strips with opposing first and second side surfaces, charge storage structures on the first and second side surfaces, and a gate structure overlying the charge storage structures on the first and second side surfaces, the gate structure having a width along the first and second side surfaces so that a grain size of the crystallized material in the active strip in a direction along the first and second side surfaces is greater than a width of the gate structure, wherein the direction is the current flow direction through the active strip.

2. The integrated circuit device of claim 1, wherein the grain size of the crystallized material in the active strip in the direction along the first and second side surfaces is greater than a pitch of two dual gate memory cells, wherein the pitch is twice the width of the gate structure.

3. The integrated circuit device of claim 1, wherein the grain size of the crystallized material in the active strip in the direction along the first and second side surfaces is greater than 100 nanometers.

4. The integrated circuit device of claim 1, wherein the grain size of the crystallized material in the active strip in the direction along the first and second side surfaces is greater than 500 nanometers.

5. The integrated circuit device of claim 1, wherein the grain size of the crystallized material in the active strip in the direction along the first and second side surfaces is greater than 5000 nanometers.

6. The integrated circuit device of claim 1, wherein the substrate has a single crystalline surface with a crystal structure orientation, and the crystallized material has the crystal structure orientation of the substrate at least near the side surfaces of the active strips.

7. The integrated circuit device of claim 1, wherein the crystallized material includes polycrystalline silicon.

8. The integrated circuit device of claim 1, further comprising:
    charge storage structures formed over the stacks of active strips, wherein the charge storage structures are in contact with the side surfaces of the active strips in the stacks; and
    conductive lines formed over the charge storage structures and arranged orthogonally over the plurality of active strips in the stacks;
    whereby memory cells are disposed in interface regions at cross-points between the side surfaces of the active strips and the conductive lines, the memory cells having channel regions in the active strips.

9. The integrated circuit device of claim 8, wherein active strips in the stacks act as bit lines and the conductive lines act as word lines.

10. The integrated circuit device of claim 8, wherein active strips in the stacks act as word lines and the conductive lines act as bit lines.

11. The integrated circuit device of claim 1, further comprising:
    interlayer connectors connected to respective active strips in the stacks; and
    patterned conductor lines connected to the respective interlayer connectors.

12. The integrated circuit device of claim 1, including circuitry to induce a current density in an active strip in the plurality of stacks of active strips during read operations of greater than 100 amperes per square centimeter ($10^2$ A/cm$^2$).

* * * * *